United States Patent [19]

Carson et al.

[11] Patent Number: 4,672,737
[45] Date of Patent: Jun. 16, 1987

[54] DETECTOR ARRAY MODULE FABRICATION PROCESS

[75] Inventors: John C. Carson, Corona Del Mar; Stewart A. Clark, Irvine, both of Calif.

[73] Assignee: Irvine Sensors Corporation, Costa Mesa, Calif.

[21] Appl. No.: 761,889

[22] Filed: Aug. 2, 1985

Related U.S. Application Data

[60] Division of Ser. No. 572,802, Jan. 23, 1984, Pat. No. 4,551,629, which is a continuation of Ser. No. 187,787, Sep. 16, 1980, abandoned.

[51] Int. Cl.$^4$ ............................................. H01L 31/18
[52] U.S. Cl. ...................................... 29/572; 156/643; 29/576 J; 29/577 R; 29/590
[58] Field of Search ................. 29/572, 576 J, 577 R, 29/590; 156/643, 630; 204/192 E; 250/578

[56] References Cited

U.S. PATENT DOCUMENTS

| | | |
|---|---|---|
| 4,196,508 | 4/1980 | Lorenze, Jr. .................... 29/577 R |
| 4,273,596 | 6/1981 | Gutierrez et al. .................. 148/171 |
| 4,290,844 | 9/1981 | Rotolante et al. ................. 156/630 |
| 4,304,624 | 12/1981 | Carson et al. ..................... 156/630 |
| 4,551,629 | 11/1985 | Carson et al. ..................... 250/578 |

Primary Examiner—Aaron Weisstuch
Attorney, Agent, or Firm—Thomas J. Plante

[57] ABSTRACT

A photo-detector array module is disclosed which comprises a stack of semiconductor chips having integrated circuitry on each chip. To permit the emplacement of photo-detectors on the focal plane end, and of thin film circuitry on the back plane end, each plane is etched to cut back the semiconductor material, then covered with passivation material, and thereafter lapped to uncover the ends of electrical leads on the chips.

15 Claims, 47 Drawing Figures

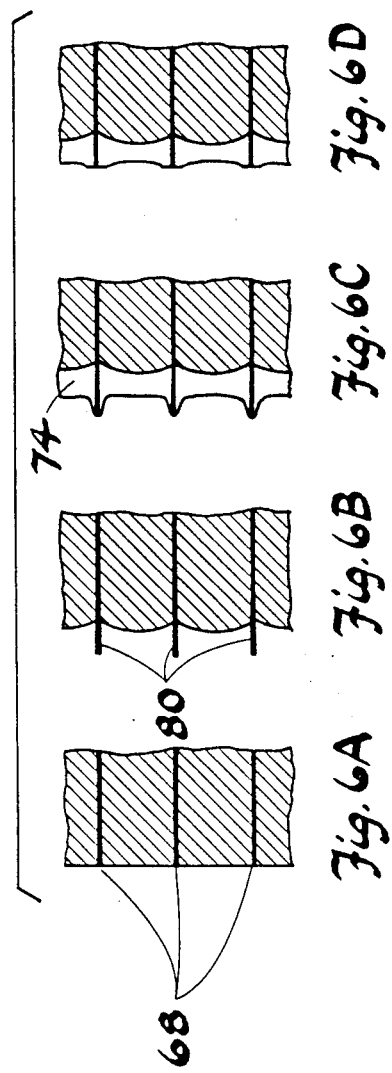

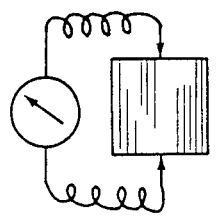
Fig. 12C LEAD LAPPING
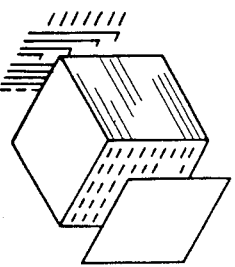
Fig. 12E TEST
Fig. 12B PASSIVATE
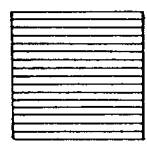
Fig. 12A ETCH
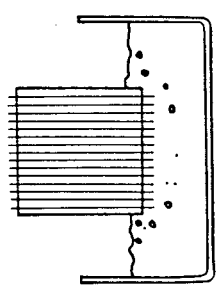
Fig. 12D FRONT & BACK METALLIZATION
Fig. 12

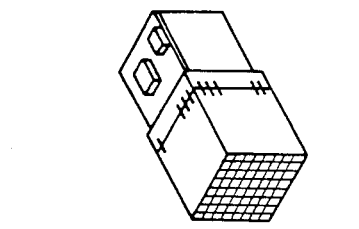
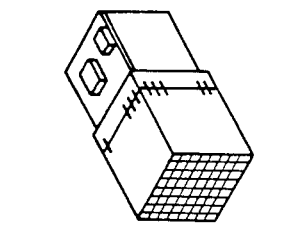
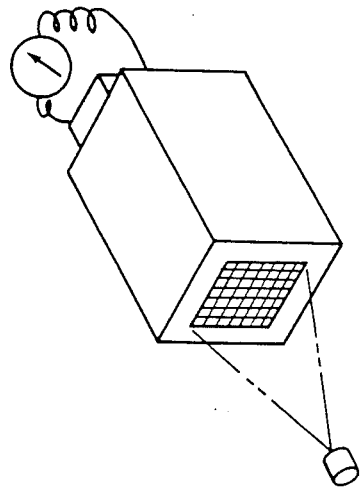
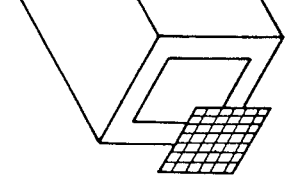
Fig. 14A INSTALL IN HOUSING
Fig. 14B APPLY DETECTORS
Fig. 14C TEST
Fig. 14D MI COMPLETE
Fig. 14

DETECTOR ARRAY MODULE FABRICATION PROCESS

This application is a division of application Ser. No. 572,802, filed Jan. 23, 1984 and now U.S. Pat. No. 4,551,629, as a continuation of application Ser. No. 187,787, filed Sept. 16, 1980, now abandoned.

BACKGROUND OF THE INVENTION

This invention relates to the field of electro-optical energy conversion apparatus and is primarily concerned with "mosaic" detector arrays which provide surveillance of an extensive scene. The mosaic detector arrays are large numbers of closely spaced individual photo-detector elements arranged in essentially a two-dimensional, or planar, array. Broadly, the invention concerns an apparatus and method relating to a module which contains densely-packed electronic components and which is adapted to carry on a planar supporting surface an array of closely-spaced but isolated electro-optical elements which cause radiative/electronic energy conversion.

An earlier patent application of Carson and Dahlgren, Ser. No. 855,242, filed Nov. 28, 1977, issued as U.S. Pat. No. 4,304,624 on Dec. 8, 1981 and assigned to the assignee of this application, discloses a detector module comprising a number of thin insulating (ceramic) layers, or substrates, secured together and extending at right angles to the focal plane of the detector array. Electrically conducting leads are supported by and located between such layers for the purpose of conducting signals away from the detectors located in the focal plane. The prefabricated layered supporting structure thus constitutes the substrate for the detector array, which is located on one end (the focal plane) of the layered supporting structure. The individual detector elements located on the focal plane are each in separate electrical contact with one of the leads appearing at the adjacent edges of the layers which constitute the supporting structure.

A large number of the separately fabricated layered structures, or modules, are butted together to form an extensive focal plane array, i.e., the individual modules are used as building blocks to build up a complete focal plane array. The completed assembled array should be as light and as small as possible, in order to facilitate its use in such fields as satellite surveillance. At the same time, it is necessary to accomplish very significant amounts of electronic processing within the focal plane array, which means that each module, or layered structure, in the array must incorporate in its "body portion" a substantial amount of electronic processing capability. Otherwise, it would not be feasible to provide electrical connections between the detector array and the processing equipment remote from the focal plane.

As pointed out in U.S. Pat. No. 4,304,624, in order that the detector-carrying modules may be butted against one another to provide a continuous surveillance array, it is necessary that any electronics contained within the modules be housed in the "volume" of space created by extending the two-dimensional surface area of the focal plane detector array in a direction perpendicular to that two-dimensional surface. Nothing must protrude from the "sides" of the individual modules; and their electrical connections to the remotely located processing equipment should, if possible, be formed by leads on the back planes of the modules.

Some of the primary considerations in developing improved modules for focal plane detector arrays are:

(1) Optimizing packing density to achieve the lowest possible mass per element, essentially the shortest module that is production worthy;

(2) Assuring end-to-end continuity of the electrical leads;

(3) Simplifying the fabrication procedures;

(4) Enhancing the structural strength of the elements;

(5) Improving reliability of the electronics and of the techniques for interconnecting the electronics with the electrical leads;

(6) Maximizing suitability for test and repair at the lowest level of assembly and throughout assembly; and (7) Minimizing the cost per element.

It is the general purpose of the present invention to make a major improvement in the apparatus and method designed to attain the listed objectives. One of the major limitations encountered with the ceramic-substrate layered modules of U.S. Pat. No. 4,304,624 has been the inefficient use of "real estate" because the lead patterns consume most of the available space. Other advantageous aspects of the present invention over the prior design discussed above are the elimination of the multiplicity of wire bonds in the module electronics, and the utilization (in the present invention) of the rear plane of the module as a surface for printed circuitry which provides electrical connection to the remote signal processing equipment.

The prior art includes Lehovec U.S. Pat. No. 3,748,479, issued July 24, 1973, and its parent U.S. Pat. No. 3,631,251, issued Dec. 28, 1971. Those patents disclose the use of a stack of silicon slabs having p-n junction photocells on their narrow edges to provide a focal plane surface, and having electrical circuit elements, including transistors, formed on the larger planar surfaces of silicon material. The Lehovec patent applies the concept of stacked silicon slabs to light emission, reception, or modulation. In the light-reception versions, which are of interest in connection with the present invention, the light sensors, or photo-detectors, in Lehovec are integrally formed as p-n junction photocells in the silicon material.

A major shortcoming of the Lehovec light-reception structures is the reliance on the treated silicon material for light sensing. This limits significantly the effective light-sensing capability of the Lehovec device. The detector material does not respond adequately unless cooled to extremely low temperatures, lower than those required for other detector materials, such as may be used with structures described in this disclosure. Furthermore, the present arts in silicon detector processing and in silicon electronics processing are not fully compatible with one another, in that high performance cannot be simultaneously achieved in detectors and electronics.

As disclosed in Rotolante and Koehler application Ser. No. 15,070, filed Feb. 26, 1979, issued as U.S. Pat. No. 4,290,844 on Sept. 22, 1981, and assigned to a company related to the assignee of this application, effective photo-detector arrays on modules of the type under discussion require the use of specialized detector materials, such as mercury-cadmium-telluride, indium antimonide, lead tin telluride, indium arsenic antimonide, indium arsenide, and indium gallium arsenide. And such detector materials necessitate a "hybrid" technology for securing the detectors to the focal plane provided by the narrow ends of the stacked substrates.

The present invention is intended to solve the problems which must be overcome in order to combine the benefits of the "hybrid" detector concepts with the use of stacked silicon chips which carry integrated electronic circuits, and which are efficiently connected to external circuitry.

SUMMARY OF THE INVENTION

The present invention provides a module constituted by a stack of semiconductor (preferably silicon) chips, or substrates, extending in layers at right angles to the front plane, with each chip having thereon: (a) integrated circuitry which provides a significant portion of the electronic processing, (b) electrical leads extending to both the front plane and the back plane of the module, and (c) suitable insulation on both the front plane and the back plane which exposes the separate electrical leads to make them individually available for electrical connection either to an individual detector (on the front plane), or to one of the lead-out circuits formed on the back plane.

Another important aspect of the present invention is the method of successfully forming the layered stack of semiconductor chips, including solutions to such problems as: (a) providing separately accessible leads on the insulated front plane and back plane, (b) connecting the leads on the back plane to their appropriate conductors without using wire bonding, and (c) properly stacking and aligning the chips in the module.

Other more specific features of both the product and method of the present invention will also be disclosed and claimed in this application.

BRIEF DESCRIPTION OF THE DRAWINGS

FIGS. 6A through 6D are cross-sectional closeups of several layers of silicon chips, illustrating the step-by-step processing used to insulate the front and back surfaces of the modules in such a way as to provide individually exposed multiple electrical leads on each surface;

FIGS. 12A through 12E are illustrations which summarize the steps taken in providing electrical contacts on the focal plane and back plane of the module;

FIGS. 14A through 14D briefly summarize the application of photo-detectors on the focal plane, thereby completing the module.

DETAILED DESCRIPTION OF PREFERRED EMBODIMENT

Figure 1:
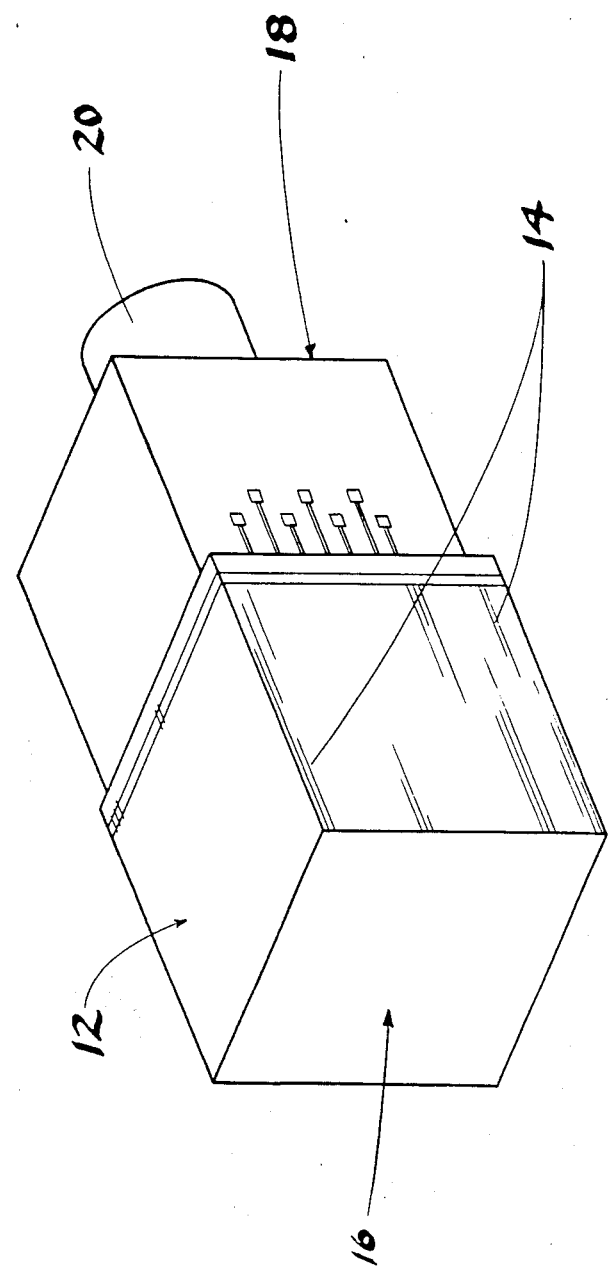
FIG. 1 is a view in perspective of a module comprising a number of stacked silicon chips, each of which provides an integrated circuit terminating in a multiplicity of electrical leads at the front end (focal plane) of the module, and a plurality of electrical leads at the rear end (lead-out plane) of the module.

FIG. 1 shows a module 12 comprising a multiplicity of layers 14, each of which is a semiconductor chip (preferably silicon) which carries an integrated circuit having suitable electrical leads terminating at a front, or focal, plane 16, where they are individually in electrical contact with separate very closely spaced photo-detectors. The module 12 is in effect, a stack, or "sandwich", comprising numerous silicon chips, or substrates, secured together by suitable adhesive material between adjacent chips. The module, or stack, may be described as a rectangular parallelepiped, since each of its surfaces is a rectangle. The stack of chips is mounted on a supporting block 18, which also functions as a heat-transfer, or cooling, structure, and which may have a mounting stud 20 for use in securing the module and its supporting block in a larger assembly. Generally the combination of the stack of silicon chips and the supporting block is considered to be a module assembly.

Figure 3:
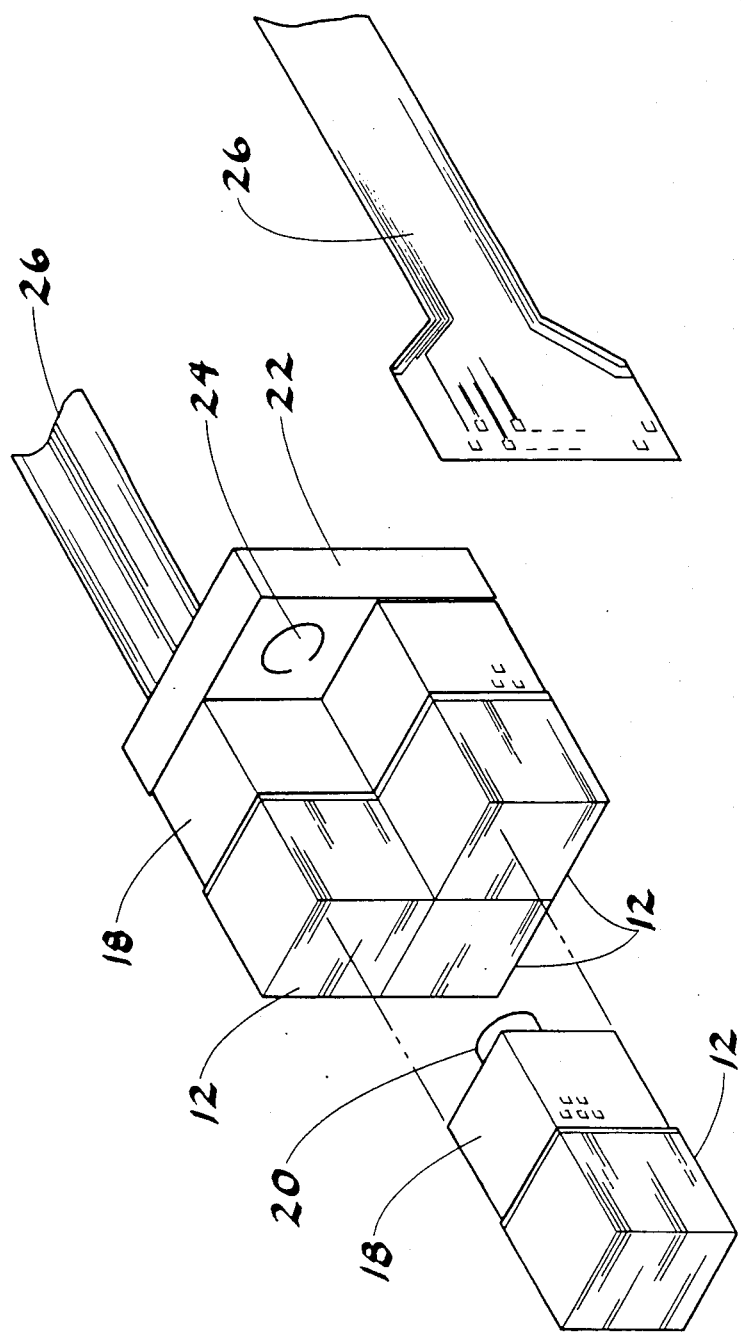
FIG. 3 is a partially exploded view in perspective showing a combination of four of the modules of FIG. 1 in a larger module which can be handled as a unit in assembling a focal plane array.

FIG. 3 shows a larger module, consisting of four of the modules 12 of FIG. 1 mounted on a single mounting plate 22, with each mounting stud 20 fitting into a hole 24 provided in mounting plate 22. Ribbon cables 26 provide electrical connections leading from the modules 12 to suitable electronic information processing equipment. The arrangement of the four-module assembly is such that each ribbon cable 26 provides electrical connections for two of the modules 12.

Figure 2:
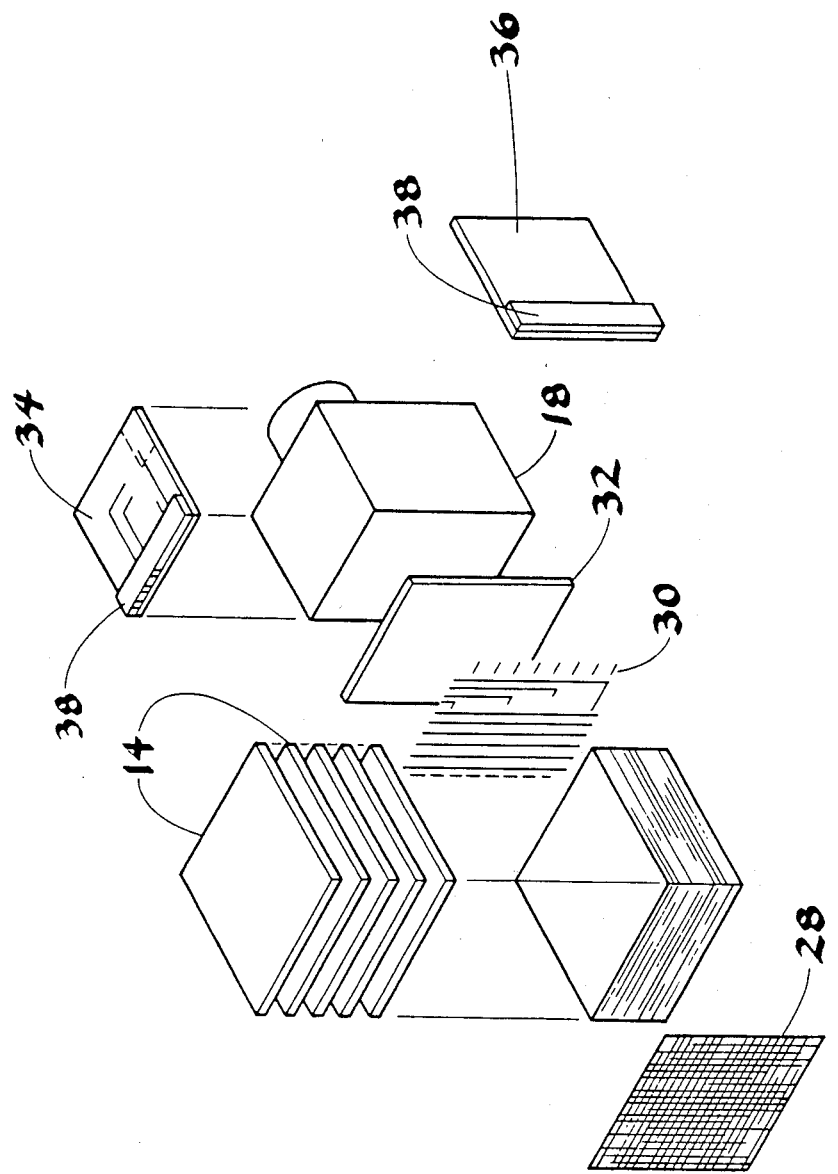
FIG. 2 is an exploded view of the detector module shown in FIG. 1.

Referring now to FIG. 2, which is an exploded view of a module 12, it is seen that it includes separately formed silicon chips 14 which, after being stacked and glued together, are provided on the front, or focal, plane with a detector "mosaic" 28 and on the rear, or back, plane with back plane wiring 30. The supporting block 18 is preferably molybdenum, selected because of its thermal compatability with silicon. It is insulated from the back plane of the silicon substrate stack by a flat insulating board 32, preferably formed of silicon having silicon oxide grown or deposited on its surfaces. Two additional insulating boards 34 and 36, also preferably formed of silicon, are secured to two sides of molybdenum block 18, and are arranged to carry lead-out conductors from the back plane wiring 30 to the ribbon cables 26. Each of the insulating boards 34 and 36 has an insulating strip 38 secured thereto, the purpose of which will be discussed below.

Figure 4:
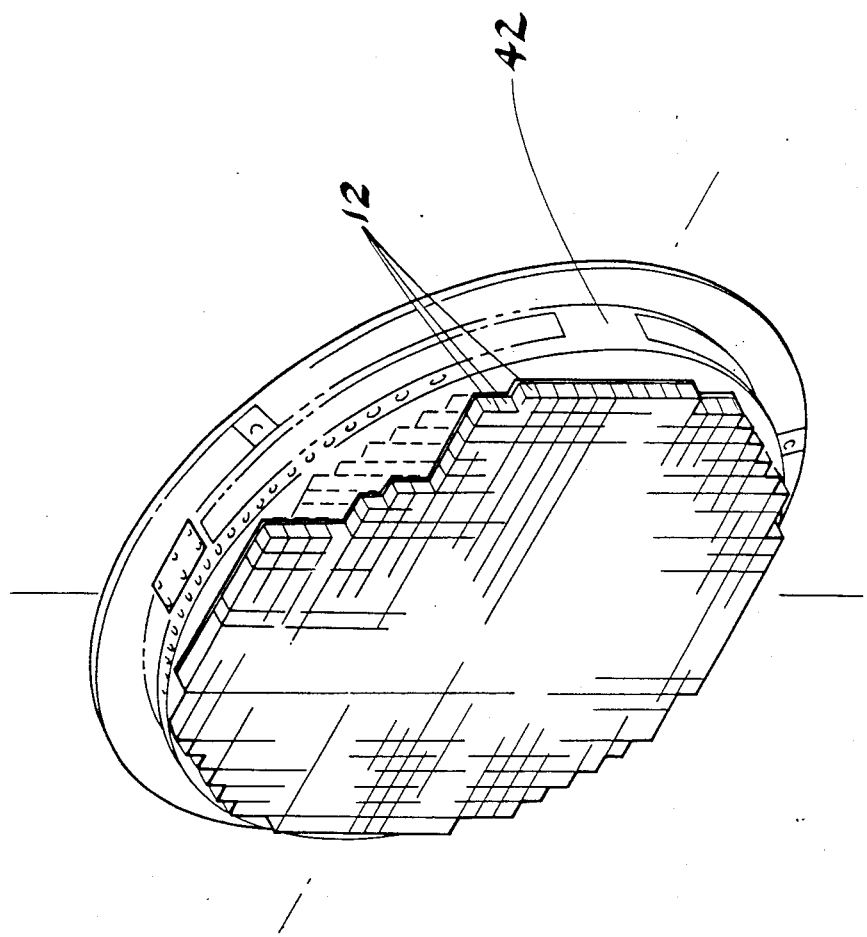
FIG. 4 is a view in perspective of a complete focal plane assembly (except for portions omitted to improve clarity), having a large number of the four-module units of FIG. 3 supported on a cold plate mounting structure.

FIG. 4 shows how a complete "focal plane assembly" might be constructed. A very large number of the four-module groups carried by the mounting plates 22 are secured to a relatively large cold plate mounting structure 42. It is important that the entire assembly be as thin as possible, both to provide effective cooling of the sensors and of the "focal plane" electronics, and to minimize the required volume and weight of the assembly.

Figure 5:
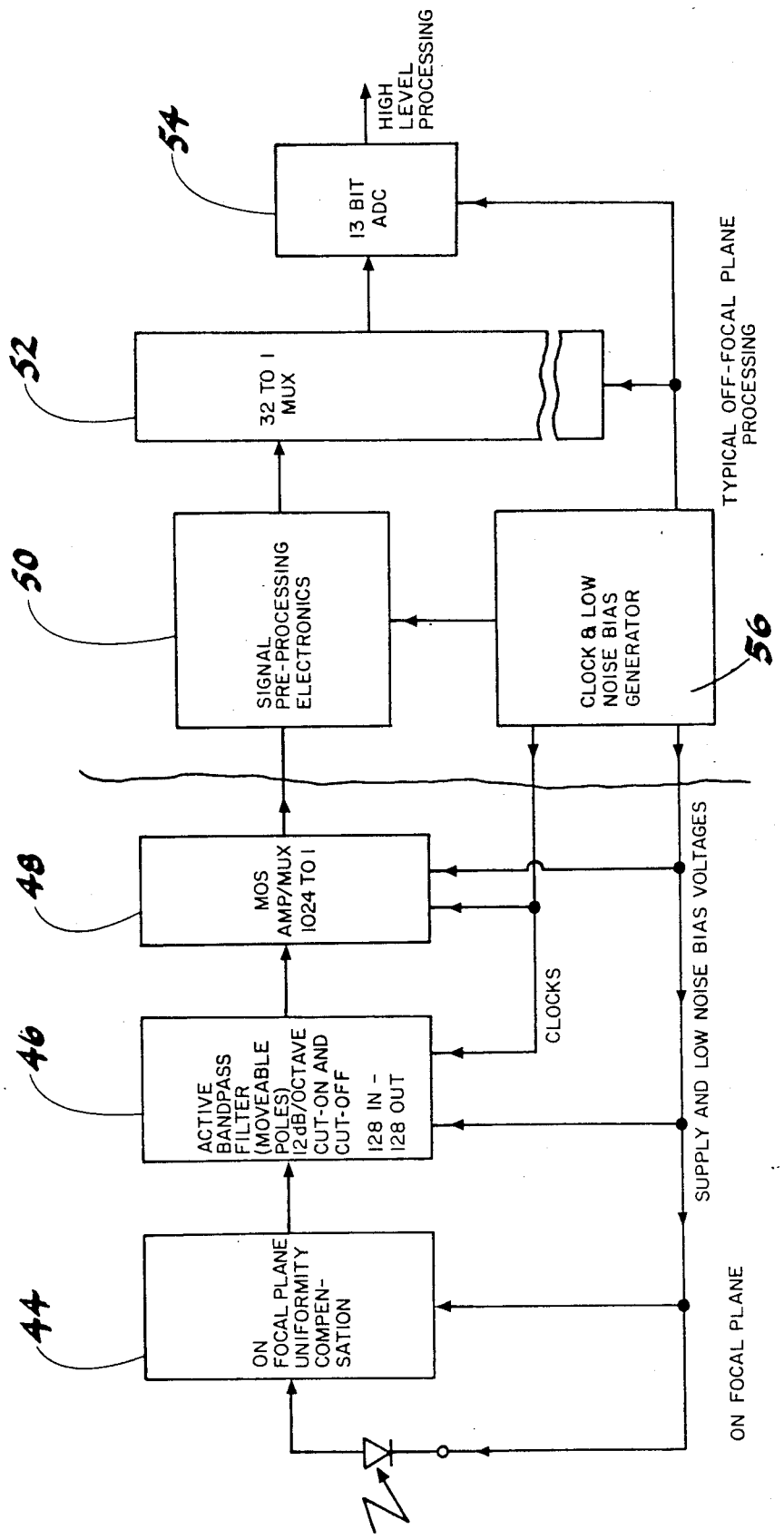
FIG. 5 is a diagrammatic showing of the electronic system, which indicates those portions located within the modular focal plane assembly, and those portions which are located remotely from the focal plane.

FIG. 5 illustrates one version of the electronics system, as it might be divided between "on-focal plane" and "off-focal plane" electronics. The integrated circuitry on each silicon chip should carry the maximum amount of electronics permitted by the available "real estate", in order to simplify connections from the focal plane assembly to the other portions of the electronic system. It should also provide large dynamic range with low noise and power dissipation, and should operate at temperatures as low as 30 degrees centigrade above absolute zero. In FIG. 5, three blocks in the diagram are shown on the stacked chips, and four blocks are shown as part of the off-focal plane electronics. Block 44, which is Non-Uniformity Gain Compensation circuitry on the chips, represents automatic gain compensation circuitry, which uses a signal developed by the detector when it is periodically flooded with a calibration signal, and automatically compensates for non-uniformity in individual detector gain or responsivity characteristics due to temperature gradients, background radiation, etc. Block 46, which is Active Adaptive Bandpass Filter Circuitry on the chips, represents adaptive bandpass filter circuitry, comprising capacitors and capacitor/electronic switch circuits to emulate resistors. And block 48, which is Multiplexer circuitry on the chips, represents MOS amplifier/multiplexer circuitry, which in the disclosed version of the system provides 1024 to 1 multiplexing leading to the remotely located electronics. The latter may include signal preprocessing electronics 50, leading to a 32 to 1 multiplexer 52, which provides signals to a 13 bit analog-to-digital converter 54, leading to high level signal processing electronics. Also included in the off-focal plane electronics is a clock and bias generator 56, which supplies biasing voltage to the detectors on the face of the modules, to the adaptive bandpass filter circuitry 46, and to the multiplexer circuitry 48; and also supplies timing signals to the adaptive bandpass filter circuitry 46, and to the multiplexer circuitry 48.

FIG. 6 illustrates a highly significant aspect of the processing which makes it possible to build the stacked silicon modules successfully. This process has been used effectively both on the front, or focal, plane and on the back plane of the modules, for the purpose of providing an insulating surface which does not cover the ends of the electrical leads but otherwise fully covers the end surfaces of the stacked silicon chips. Since the silicon substrate is a doped semiconductor, any failure to insulate any of its exposed surfaces will lead to short circuits.

Figure 7A:
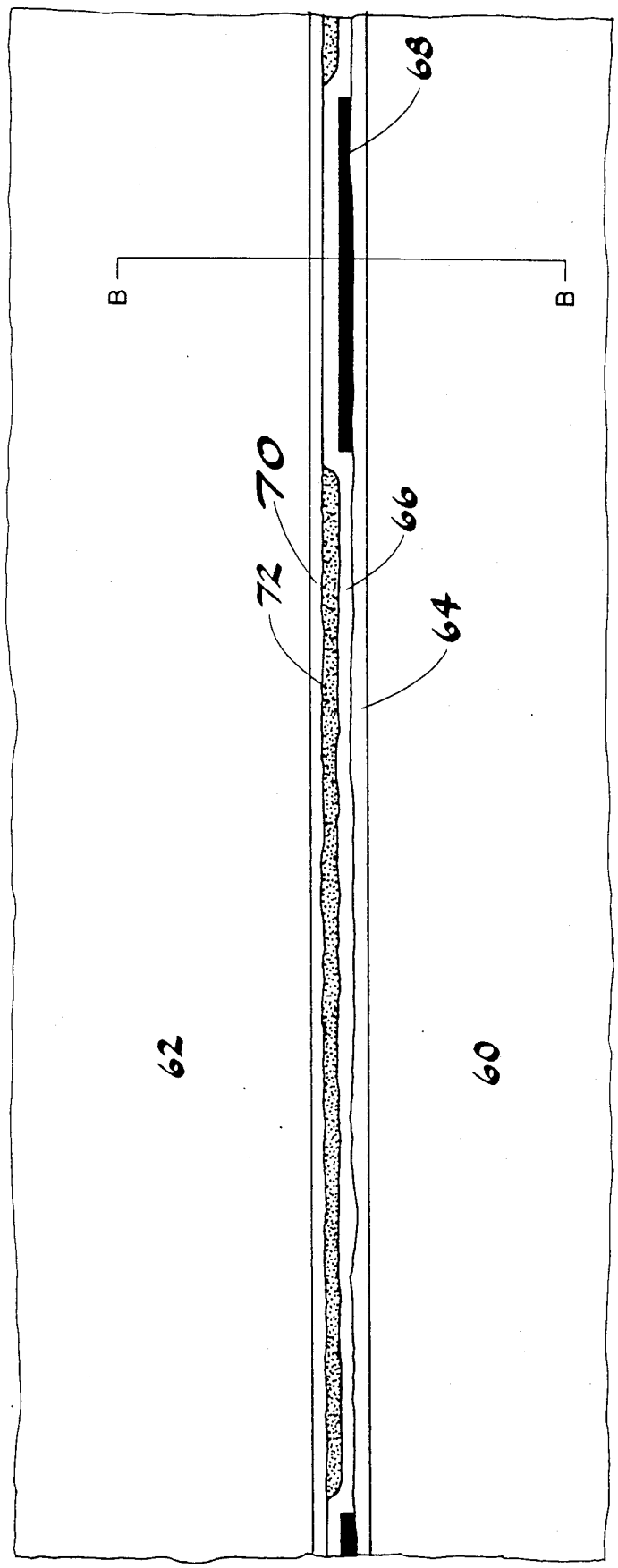
FIGS. 7A and 7B are greatly magnified sectional closeups showing an individual electrical lead on the focal plane contacting the conductive epoxy which secures a single photo-detector in postion.
Figure 7B:
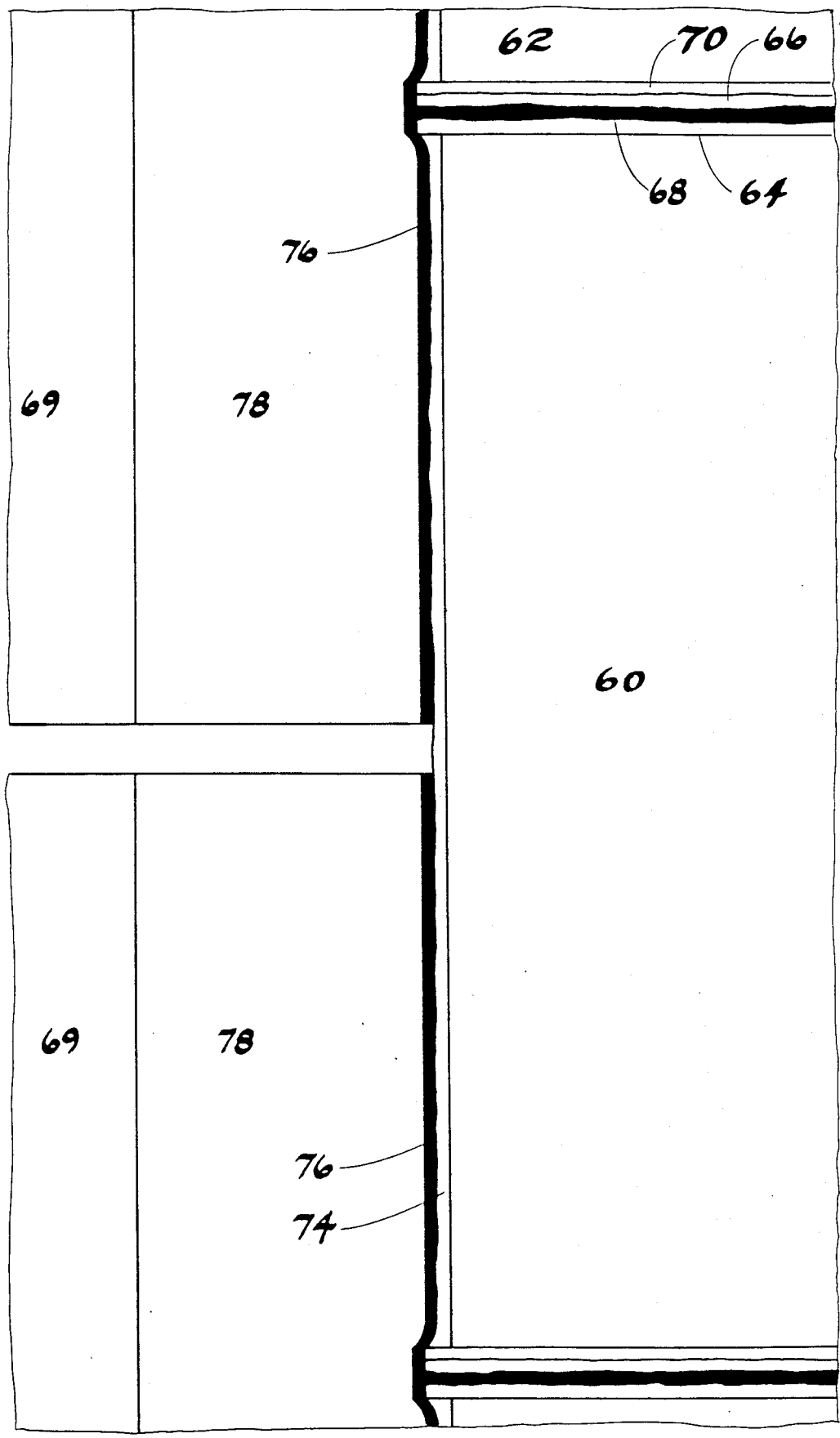

Before explaining the unique process, the steps of which are illustrated in FIG. 6, it will be useful to understand clearly the final result which must be achieved in connecting the electrical leads on the focal plane individually to separate detectors. FIGS. 7A and 7B are greatly magnified cross sections showing the relation of the individual electrical leads to their separate photo-detectors. FIG. 7A shows the intersection of two stacked silicon chips; and FIG. 7B is a cross section on the line B—B of FIG. 7A showing the relation of the end of a silicon chip, and the electrical leads, to the bottom of the detectors.

In FIG. 7A a lower silicon chip, or substrate, is indicated at 60, and an upper silicon chip, or substrate, is indicated at 62. The lower chip 60 has two thin layers of silicon oxide ($SiO_x$) which insulate the upper planar surface of the chip. A first layer 64 is located directly on the upper surface of the chip; a second layer 66 is provided to cover the metal leads, one of which is identified by the numeral 68. As seen in FIG. 7A, the second $SiO_x$ layer 66 has undulations in its profile because it covers the leads 68. These layers of insulation are either grown on, or deposited on, the original silicon wafer by the supplier, who also provides the integral individual electrode leads 68 lying on top of the lower silicon oxide layer 64. Preferably the upper chip 62 also has a thin layer of silicon oxide 70 which insulates the lower planar surface of chip 62. This layer of insulation is not formed on the original silicon wafer, for reasons which will become apparent in the detailed processing description, but is applied by deposition just before the chip is laminated into the module stack.

As seen in FIG. 7A, an epoxy layer 72 is used to glue the chips 60 and 62 together. Forcing the chips together during the stacking process tends to displace the epoxy from the space occupied by the metal leads 68; so the epoxy is located between the leads, as shown. A type of epoxy which has proved suitable for the gluing of the silicon chips is unfilled Epotek H77.

A fundamental problem which must be solved, and which has proved very difficult to solve, in order to successfully use stacked silicon chips, is the passivation (insulation) of the focal plane edges of the chips. This layer of passivation, which may also be formed of $SiO_x$, is identified by the numeral 74 in FIG. 7B. As shown, this layer should fully cover the left edges (as oriented in FIG. 7B) of the chips 60 and 62 without covering the left end of the metal conductor 68, which must be in electrical contact with the individual detector 69 through the conductive epoxy 78. If the detector emplacement process is carried out in accordance with the disclosure of application Ser. No. 15,070, now U.S. Pat. No. 4,290,844, a metallic layer 76 will be deposited on the focal plane surface on top of the passivation layer 74, after which a thicker layer of conductive epoxy 78 will be applied, as the means for securing the wafers of detector material to the focal plane. Thereafter, the detector material wafers will be cut into isolated "islands" by a suitable material removal process, such as ion milling. Clearly it is necessary that the metallic leads 68 have effective electrical contact with the metal layer 76, in order to receive signals from the respective detector islands.

Two available but unsatisfactory prior art methods for attempting to insulate the focal plane ends of the stacked chips completely, except for the ends of the leads, are (a) thermal growth of native silicon oxide selectively on the silicon, and (b) photolithographic methods of selectively etching holes through a deposited insulating coating to expose the ends of the leads. Selective growth of the native oxide is not possible because high temperatures and/or high voltages would degrade other materials in the completed structure such as the adhesive, lead metallization, and low level circuits. Photolithographic techniques are not feasible because the accuracies of the dimensions between adjacent rows of the leads are determined in part by wafer lapping accuracy. The very small pad overlap at the lead end permitted by the thin passivation layers 64, 66 and 70 applied to the original silicon wafers requires lead placement tolerances smaller than can be obtained by lapping and stack fabrication techniques.

The unique method developed to cover the focal plane ends of the stacked chips completely with an insulation layer, except for the ends of the leads 68, is best understood with reference to FIGS. 6A to 6D. In FIG. 6A, a stack of silicon chips (part of a module) is shown in cross section, with metallic leads 68 therebetween (insulation between layers is not shown). The left end of the module should be lapped, in order to provide a smooth focal plane surface and insure that the leads 68 are exposed.

The next step is to etch the edges of the silicon chips. In FIG. 6B, the left (focal plane) edges of the chips have been etched to remove the silicon to a depth of about 0.0005 inch, causing the etch-resistant ends 80 of the leads 68 to protrude, as shown. After that, as shown in FIG. 6C, the passivation layer 74 is deposited on the focal plane ends of the stacked chips. And finally, as illustrated in FIG. 6D, the left end of the stacked chip module is lapped, preferably with a relatively soft lapping compound, in order to uncover the tips of leads 68 without removing the passivation layer 74 from the edges of the silicon chips.

The effective performance of the method illustrated in FIGS. 6A to 6D has proved to be very difficult to accomplish, primarily because of the necessity that the ends 80 of the leads 68 protrude as straight as possible after removal of the silicon material. If the ends of the leads bend, they will "shadow" the adjoining silicon area during passivation, thereby tending to cause a short circuit to the silicon from metallization applied over the passivation.

Since the thin film metal leads are considered to be too weak to be self-supporting, it is assumed that one of the other contiguous materials, either the epoxy layer or the silicon oxide layers between the chips, must be relied on to prevent collapse of the protruding leads when the silicon edges are etched.

It was originally believed that the epoxy layer would usefully support the metal leads; so the etchant chosen was intended not to attack significantly either the metal or the epoxy. However, experimentation has led to the conclusion that the layers of $SiO_x$ insulating material provide the most effective support for the metal leads. Accordingly, it is important to use etching material which does not significantly attack the silicon oxide.

A surprising discovery was the apparent negative effect of the epoxy on the metal leads during the etching process. It appears that the etching material used on the silicon causes the epoxy to swell. This swelling of the epoxy results in crumbling of the protruding silicon oxide which is left unsupported as the silicon is removed. Crumbling of the silicon oxide removes support from the protruding metal leads. Accordingly, it is desirable to include an etching step in which the epoxy edges are etched away before the etching step which acts on the silicon.

The epoxy etching may be accomplished effectively using hot sodium hydroxide, i.e., by applying a 25 percent solution of NaOH at 90° C. The epoxy preferably is etched away to a depth of about 0.001 inch. Thereafter, the silicon may be etched away, preferably to slightly less depth than the epoxy, using a standard silicon etch, such as nitric acid ($HNO_3$) and hydrofluoric acid (HF) combined in a 4:1 ratio.

Providing the passivation layer, after the etching has been carried out, may be accomplished by vacuum depositing $SiO_x$. This may be done by evaporating SiO in a vacuum chamber (in which the module has been placed), while bleeding $O_2$ into the chamber. The resulting silicon oxide layer comprises both SiO and $SiO_2$. Other insulation-layer-adding possibilities have been considered and/or tried. Selection of $SiO_x$ as the passivation material is based on the convenient availability of equipment. A passivation epoxy, such as Epotek H77, has been tried, but it was not satisfactory because of a tendency to "peel away" from the silicon. Silicon nitride ($Si_3N_4$) would be a preferable insulation material because it provides a tougher film. However, the normal processes by which a layer of silicon nitride would be formed would be either sputtering, or growing the layer on the silicon of the chips. Sputtering was not considered desirable primarily because sputtering equipment was not conveniently available. Growing the insulation material is not feasible because the electrical energy and/or heat involved in such a process might damage the circuitry on the chips. Except for this consideration, it would appear that an ideal solution to the passivation layer problem would be to anodize the silicon to form passivation on the silicon only, without covering the metal leads. Another type of passivation successfully tried was reactively sputtered aluminium oxide.

A promising procedure, which is being investigated, involves the use of a plasma processing scheme which would accomplish both the etching step and the insulation-depositing step with the same equipment. The silicon would be etched by a dry plasma etching process (isotropic) in a vacuum chamber. And the passivation step would be accomplished immediately thereafter in the same vacuum chamber by introducing, and exciting, reactant gases to cause the deposition of silicon nitride (a preferred material, as stated).

The plasma process achieves etching through the use of an excited gas plasma which eliminates the need for wet chemical etchants. The stacked chips to be etched are loaded in a planar reaction chamber and the lid is closed. Air is then pumped out of the chamber to create a vacuum. The etch gas is introduced into the chamber at a constant rate, and power is applied to ionize the gas. The gas forms chemically active radicals which react with photo-resist-free substrate surfaces to accomplish the etching.

The plasma process for film deposition is a function of time, gas, pressure, power, and temperature. After substrates have been loaded in a planar reaction chamber, the system is pumped down, and substrates are heated to predetermined temperatures. For silicon nitride deposition, silane and nitrogen reactant gases are introduced into the chamber. Power is applied to create a highly energetic plasma in which the nitrogen gas is dissociated. The dissociated gas interacts with silane to deposit silicon nitride film on the substrate surface.

The vacuum chamber plasma process would have the additional advantage of being a dry process, which should not cause swelling of the epoxy; and therefore it would eliminate the need for the separate epoxy etching step discussed above. Additional information indicates that, for the reasons first stated, this dry etching process is, in fact, the most satisfactory way of accomplishing the substrate etching, and requires only one etching step.

Figure 8:
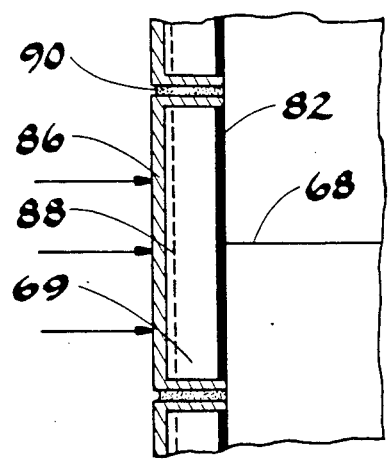
FIG. 8 is a cross-sectional closeup showing detectors mounted on the focal plane of the module and in individual electrical contact with separate electrical leads on the focal plane edges of the silicon chip layers.

The steps required to form or place individual detectors on the focal plane of the module, in separate electrical contact with the ends 80 of the metal leads 68, are preferably performed as the final steps in preparing the modules shown in FIGS. 1 and 2. These final steps, which will be further discussed below, will result in a structure having a cross section similar to that shown in FIG. 8, which is identical to FIG. 7 of application Ser. No. 15,070, now U.S. Pat. No. 4,290,884 except that the identifying numerals have been changed. The combined layers of metal 76 and of conducting epoxy 78, which were deposited on the focal plane face of the module, are indicated at 82 in FIG. 8. Each individual detector 69 is in contact with a single lead 68, and is an "island" physically and electrically separated from the other detectors. Each detector 84 is covered with a layer of transparent passivation 86, and has a diode junction 88 formed therein. The spaces, or channels, which separate detectors 84 are filled with a dielectric material 90, which provides mechanical support for the individual detectors.

Another major problem encountered in providing a functional module of stacked silicon chips is the connection of back plane wiring. It is highly desirable to avoid the use of wire bonding techniques because of the real estate required and because of the processing complexities. It is also desirable to avoid using any electrical connections which require extending leads around the edges, or corners, of their supporting substrates. This is true because buildup of photo-resist on the corners, during a metallization-depositing process, is likely to cause shorting leads along the substrate edges.

Therefore, it is desired to provide metallization 30 deposited (using thin film processing) on the back plane of the stacked silicon chips, which is in effective electrical contact both with the appropriate leads on the back edges of the chips, and with the electrical leads which connect to the external (off-focal-plane) electronic circuitry.

Figure 9:
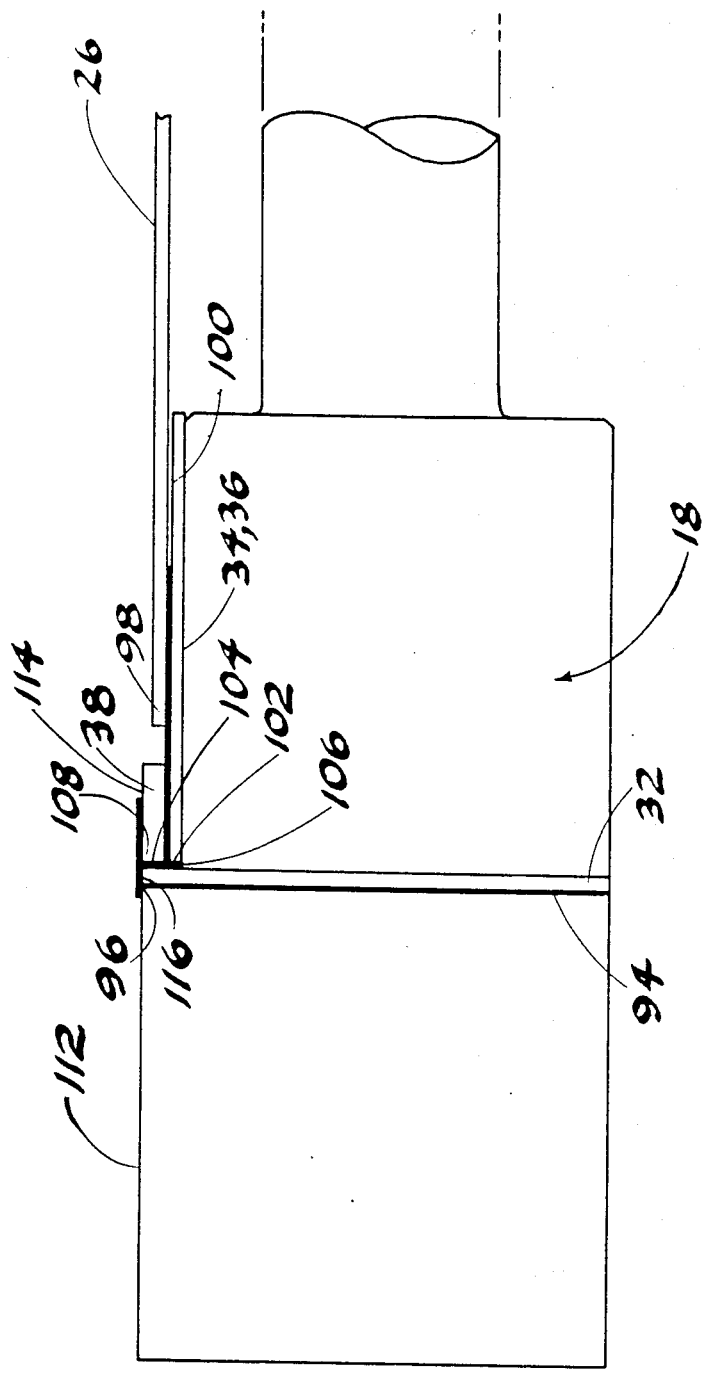
FIG. 9 is a cross-sectional view through a module illustrating the thin film electrical conductors which connect the leads on the rear of the silicon layer stack with the signal cable leading away from the focal plane assembly.
Figure 10:
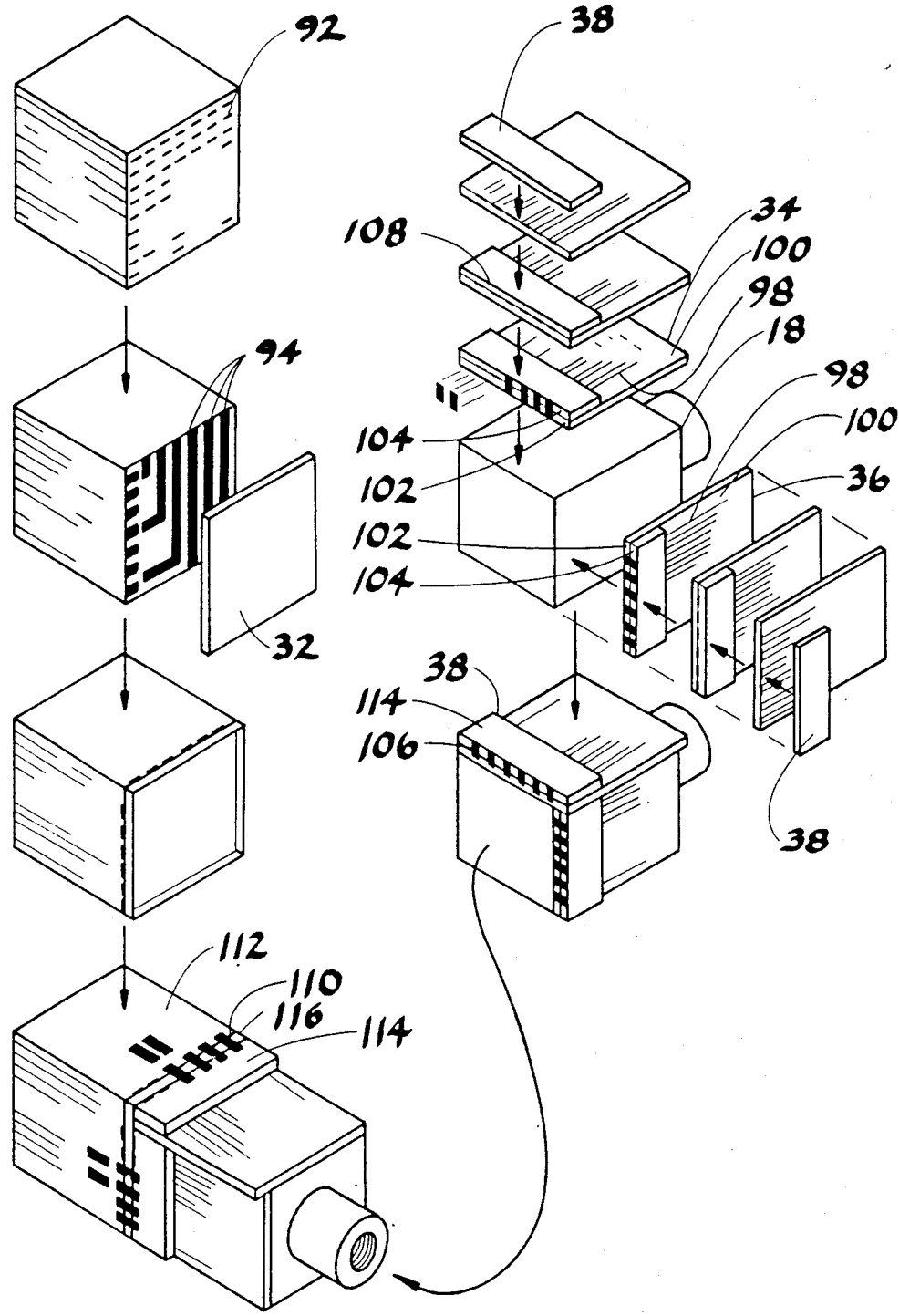
FIG. 10 is an exploded view in perspective illustrating the steps required to make the electrical connections shown in FIG. 9.

FIGS. 9 and 10 show the unique construction and method which have solved this problem. The electrical leads 92 which reach the back plane of the module must be effectively connected to conductors provided on the ribbon cables 26. The number of separate leads 92 which intersect the back plane of the module will obviously be much smaller than the number of detector-connected leads on the front plane of the module because of the multiplexing electronics (e.g., 1024 to 1) on each chip. However, in addition to the signals coming out from the chips, there will be back plane leads going into the chips; namely, bias voltages, clocks, and control signals.

Two concepts have provided the processing which successfully, and economically, carries the electrical leads from the back plane of the chips to the ribbon cables. The first is the process already described, and illustrated in FIGS. 6A–D, for passivating the edges of the chips and yet providing uncovered leads on the planar surface provided by the stacked chips. The second is a series of metallization steps which provide a series of "T-shaped" electrical joints to carry the leads around the edges of the substrates.

The first concept, as already described, provides a lapping-etching-passivating-lapping sequence which results in uncovered, accessible leads intersecting the plane on which connecting metallization is to be deposited.

The second concept, as seen in FIGS. 9 and 10, includes three metallizing steps which form "T-shaped" electrical junctions by depositing conductor stripes on top of the plane-intersecting ends of electrical leads. It is considered important that the metal stripes overlap the ends of the leads by at least, 0.0005 to 0.001 inch, thus forming a "T" which insures good electrical contact.

The metallization 30 formed on the back plane by any suitable technique, such as photo-delineation followed by etching, includes a plurality of conductor stripes 94, each of which over-lies, and is in contact with, the appropriate group of leads 92 on the back plane. The conductor stripes 94 lead to one edge 96 of the back plane.

At the other end of the lead-out connections, a plurality of conductor stripes 98 are formed by a suitable metallization-depositing process on the surface 100 of the insulating board 34 (or 36), which is secured to a side of molybdenum supporting block 18. The conductor stripes 98 may be split tip welded to the conductors carried by ribbon cable 26; and the stripes 98 lead to the inner edge 102 of board 34 (or 36) nearest the silicon chips. In order to permit "T-shaped" electrical junctions to be formed at the ends of stripes 98, the insulating strip 38 is secured to board 34 (or 36), and provides an edge 104 adjoining edge 102 on the board. A plurality of conductor stripes 106 are formed by a suitable metallization-depositing process on the plane formed by the adjoining edges 104 and 102. The stripes 106 lead to the outer edge 108 of the insulating strip 38.

The remaining step required to complete the lead-out connections is to join the respective conductor stripes 94 (on the back plane) with the stripes 106, by means of a T-shaped connection. Insulating board 32 is placed between the back plane of the stacked chips and the supporting block assembly; and those structures are glued together. Then conductor stripes 110 are formed by a suitable metallization-depositing process on the plane formed by the outer surface 112 of the module of stacked chips, the outer surface 114 of strip 38, and the outer edge 116 of insulating board 32.

Each of the three metallization-depositing steps is preceded by etching, passivation, and lapping, of the planar surfaces, and results in a T-shaped electrical contact, in that the conductor stripes deposited on the planar surfaces extend beyond the intersecting ends of the leads appearing on those surfaces.

The remaining figures outline the complete step-by-step process which is the presently preferred method of fabricating the module 12 containing the stacked silicon chips.

Figure 11:
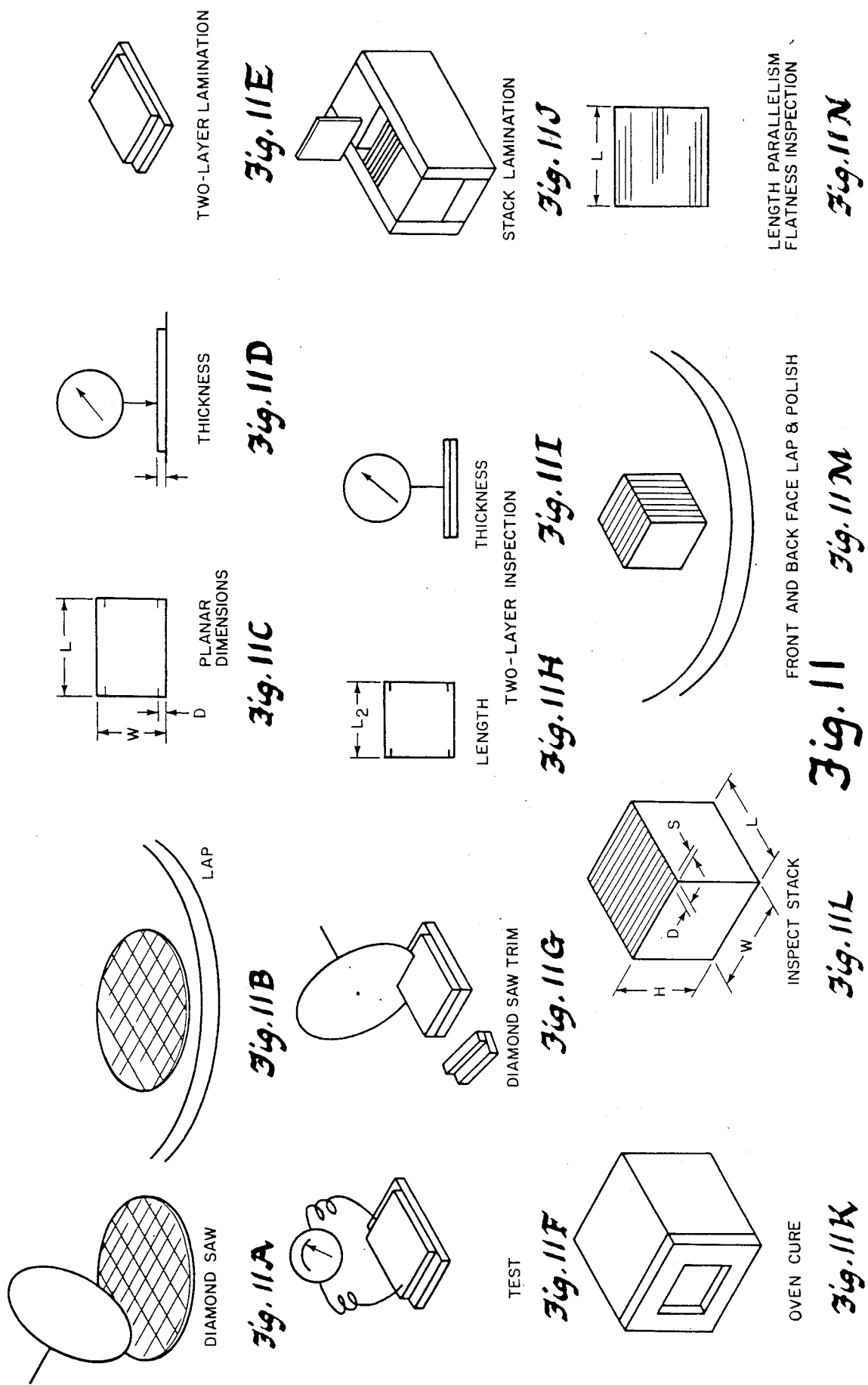
FIGS. 11A through 11N are illustrations, generally in perspective, which outline the steps taken in building a stack of silicon chips to form a module.

FIGS. 11A through 11N carry the process from the initial silicon wafers to the completed stack of silicon chips. FIGS. 11A and 11B illustrate the steps used to dice the silicon wafers to form the individual integrated circuit chips 14. The wafers have a nominal thickness of 0.01 inch. As shown in FIG. 11A, the first step is to use a diamond saw to cut interstecting grooves to a depth of, say, 0.006 inch into the circuit-carrying surface of the wafer. Then, as illustrated in FIG. 11B, the other side of the wafer is lapped until a final thickness of 0.004 inch is achieved. In practice, the grooved wafer is placed face down on a lapping flat covered with an adhesive material which retains the pieces of the wafer in position after the lapping reaches the grooves, thereby dividing the wafer into small rectangular chips.

The next step, which is not illustrated, is depositing passivation on the undersides of the chips. Then, as shown, in FIGS. 11C and 11D, the planar dimensions and thickness of each chip are checked. The planar dimensions, including length, width, and signal lead edge distance, may be checked using a toolmaker's microscope capable of measuring to an accuracy of ±0.00005 inch. The thickness may be measured using a digital height gauge capable of measuring to an accuracy of ±0.0005 inch.

FIGS. 11E through 11I show a two-layer lamination procedure, which is the presently preferred method, because the two-layer combinations permit convenient electrical testing, and also provide structural reinforcement not available when single chips are being handled. As shown in FIGS. 11E and 11F, the two layers secured together may initially have different lengths, in order to simplify testing. Then, as seen in FIG. 11G, a diamond saw is used to trim both chips to the desired dimensions, which are carefully checked, as indicated in FIGS. 11H and 11I, using a toolmaker's microscope. The bonding of the two layers may be accomplished in a special fixture. Alignment of conductor ends on the two layers must be within ±0.0002 inch.

The next step, as illustrated in FIG. 11J, is lamination of the complete stack of silicon chips, combining enough two-stack layers to provide the selected number of layers. The stacking fixture and alignment process must insure alignment of conductor ends within ±0.0002 inch. While the number of layers chosen is arbitrary, it has been convenient to work with 128-layer modules, each having planar dimensions of approximately 0.5 inch by 0.5 inch. If the stack includes 128 chips, each having 128 detector leads on its focal plane edge, the module will carry 16,384 detectors.

As indicated in FIG. 11K, an oven cure is next used to set the epoxy which bonds the layers. After another inspection (FIG. 11L), the front (focal plane), and back faces of the stacked chip module are lapped and polished (FIG. 11M). Another inspection is indicated by FIG. 11N.

FIGS. 12A to 12E illustrate the important series of steps needed to provide metallization on the front and back faces of the module. First, as shown in FIG. 12A, both the front and back surfaces of the module are separately etched to remove the silicon to a depth of about 0.0005 inch, as previously discussed. During the separate etching of the front and back surfaces, the other four faces of the cube should all be protected from the etching by passivation.

Next, passivation is applied to both the front and back surfaces, as shown in FIG. 12B. Then the front and back surfaces are lapped to uncover the leads (FIG. 12C). And thereafter metallization is applied separately to both the front and back surfaces by a thin film deposition process (FIG. 12D). The metallized pattern on the back surface provides the desired conductor stripes, as previously described. On the front surface, a complete layer of metallization is shown. This is the approach which is used if the detector "islands" are going to be isolated by cutting channels in a detector material wafer after such a wafer has been bonded to the face of the module. During the channel cutting process used to isolate the detectors (such as ion milling, discussed in application Ser. No. 15,070, now U.S. Pat. No. 4,290,844), the metallized layer shown in FIG. 12D will also be cut through, thus forming the isolated "islands" corresponding to the respective detectors. If the passivation on the front surface of the module is also cut through during this process, no harm is done because each detector remains electrically isolated except for its individual conductor lead (and the common electrode formed on the top side of the detector islands). FIG. 12E illustrates an electrical signal testing step, which is next performed.

Figure 13:
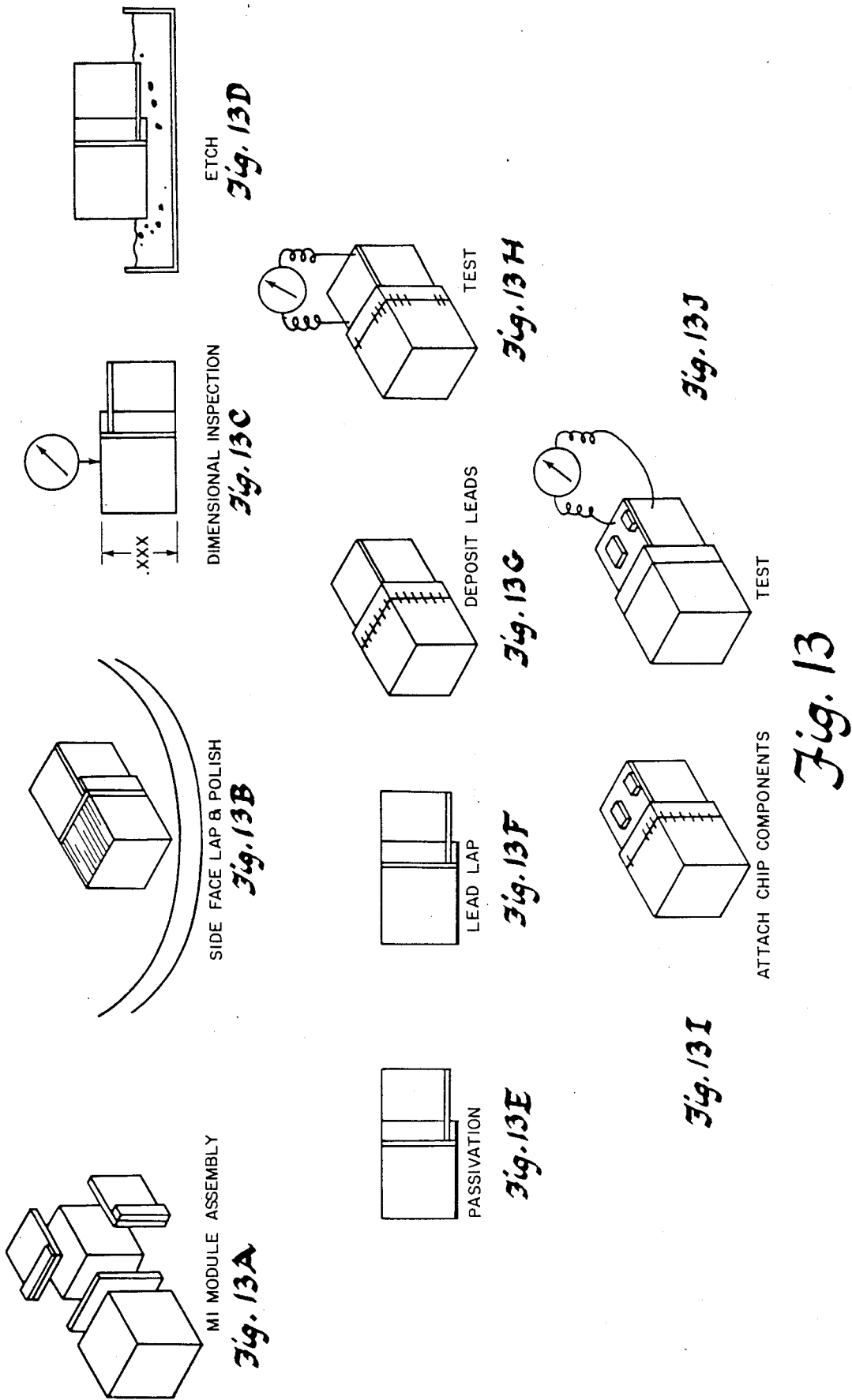
FIGS. 13A through 13J are illustrations showing the steps taken to assemble the remaining parts of the module, and to complete the electrical connections at the back of the module.

FIGS. 13A to 13J show the assembling and processing of the complete module, including mounting of the silicon stack on the molybdenum supporting block, and depositing conductors which lead out of the back plane to exterior circuitry. As shown in FIG. 13A, the parts of the complete module are placed together, carefully aligned, and bonded. The parts are the silicon stack 12, the molybdenum supporting block 18, and the insulating boards 32, 34 and 36.

Then each of the two side faces of the module on which conductor stripes are to be deposited will be separately taken through the same process steps as those used in providing electrical connections on the front and back surfaces of the stacked chips. Each of the two side faces will be lapped and polished (FIG. 13B), inspected (FIG. 13C), etched to cut back slightly the silicon (FIG. 13D), covered with passivation (FIG. 13E), and lapped to uncover the leads (FIG. 13F). Then the final T-shaped leads will be formed, as shown in FIG. 13G, by depositing short conductor stripes on the surface to interconnect the stripes on the back surface of the silicon stack with those on the front end of the insulating boards 34 and 36. Those boards have already been provided with the T-shaped connections leading to the ribbon cables. FIGS. 13H to 13J show an electrical testing step, then attaching additional chips on one insulating board surface, and finally another electrical testing step.

FIGS. 14A to 14D refer to the final steps in completing the functioning focal plane module, i.e., placing photo-detectors on the face of the module, each in individual electrical contact with a single lead appearing at the face of the module. The presently preferred method of forming the individual detector, is that disclosed in application Ser. No. 15,070, now U.S. Pat. No. 4,290,844, which is incorporated herein by reference. However, other methods of placing or forming individual photo-detectors on the face of the module could be used without departing from the scope of the present invention. Such alternative methods include indium bump bonding, or thin film.

FIG. 14A shows the module installed in a protective housing, on the assumption that it would be sent to another facility for detector emplacement. The remaining FIGS. (14B to 14D) briefly list the detector application process (which is itself a complex series of steps), and subsequent final testing, leading to completion of the module. The module is then ready to be installed with other modules in a four-module group, as seen in FIG. 3; and a large number of those groups are installed in a complete focal plane assembly, such as the one illustrated in FIG. 4.

The following claims are intended not only to cover the specific embodiments disclosed, but also to cover the inventive concepts explained herein with the maximum breadth and comprehensiveness permitted by the prior art.

What is claimed is:

1. A method for fabricating a photo-detector array module comprising:

providing a number of equal-sized semiconductor chips, each having integrated circuitry thereon, and each having a multiplicity of closely spaced electrical contact points at one end thereof;

stacking and bonding the semiconductor chips to form a rectangular parallelepiped structure with the electrical contact points in an array of closely spaced points on the focal plane end of the stacked chips;

etching the focal plane ends of the stacked chips to remove a small amount of the body material of the chips while leaving the contact points protruding;

depositing insulation material to cover the etched focal plane ends of the stacked chips;

removing sufficient material from the insulation-covered ends of the stacked chips to uncover the electrical contact points; and placing a multiplicity of photo-detectors on the insulation-covered ends of the stacked chips in such a way that each photo-detector is in electrical contact with a single electrical contact point, while being otherwise insulated from the body material of the semiconductor chips.

2. The photo-detector fabricating array method of claim 1 wherein the step of placing photo-detectors on the stacked chips includes:

depositing a metallic layer on the insulation-covered focal plane ends of the stacked chips;

bonding photo-detector material to the metallic layer with conductive bonding material; and dividing the photo-detector material and the underlying conductive material into islands which provide individual photo-detectors.

3. The photo-detector array fabricating method of claim 2 wherein the step of etching the ends of the stacked chips is accomplished by a dry process using a gas plasma.

4. The photo-detector array fabricating method of claim 2 wherein each chip in the stack is separated from the adjacent chips by insulating material overlying the integrated circuitry, and the electrical contact points are partially supported by such material during the steps of first etching, and then depositing insulation material on, the focal plane ends of the chips, thereby preventing the protruding contact points from making electrical contact with the chip substrates.

5. The photo-detector array fabricating method of claim 1 wherein the step of etching the ends of the stacked chips includes:

etching back the material used to bond the stack of chips together; and then etching the ends of the stacked chips to remove a small amount of the body material.

6. The photo-detector array fabricating method of claim 1 wherein the step of etching the ends of the stacked chips is accomplished by a dry process using a gas plasma.

7. The photo-detector array fabricating method of claim 1 wherein each chip in the stack is separated from the adjacent chips by insulating material overlying the integrated circuitry, and the electrical contact points are partially supported by such material during the steps of first etching, and then depositing insulation material on, the focal plane ends of the chips, thereby preventing the protruding contact points from making electrical contact with the chip substrates.

8. A method for fabricating a photo-detector array module comprising:

providing a number of equal-sized semiconductor chips, each having integrated circuitry thereon, and each having a plurality of electrical contact points at one end thereof provided by the ends of the metal leads formed as part of the integrated circuitry on the substrate;

stacking and bonding the semiconductor chips to form a rectangular parallelepiped structure with the electrical contact points on the back plane end of the stacked chips;

etching the back plane end of the stacked chips to remove a small amount of the body material of the chips to leave the contact points protruding;

depositing insulation material on the etched ends of the stacked chips to cover the back plane;

removing sufficient material from the back plane to uncover the electrical contact points;

forming thin film conductors on the back plane to make contact with appropriate electrical contact points thereon, each conductor extending across the end of its contact points to provide a T-shaped junction; and providing electrical connections leading from the conductors on the back plane to exterior circuitry.

9. The photo-detector array fabricating method of claim 8 wherein the step of providing electrical connections to external circuitry includes:

forming T-shaped thin film junctions over the ends of the conductors on the back plane to provide electrical connections extending perpendicular to the back plane.

10. A method for fabricating a photo-detector array module comprising:

providing a number of equal-sized semiconductor chips, each having a semiconductor substrate with integrated circuitry thereon, and each having a multiplicity of closely spaced electrical contact points at one end thereof provided by the ends of the metal leads formed as part of the integrated circuitry on the substrate;

stacking and bonding the semiconductor chips to form a rectangular parallelepiped structure with the electrical contact points in an array of closely spaced points on the focal plane ends of the stacked chips;

etching the focal plane ends of the stacked chips to remove a small amount of the body material of the chips while leaving the contact points protruding;

depositing insulation material to cover the etched focal plane ends of the stacked chips;

removing sufficient material from the insulation-covered ends of the stacked chips to uncover the electrical contact points; and placing a multiplicity of photo-detectors on the insulation-covered ends of the stacked chips in such a way that each photo-detector is in electrical contact with a single electrical contact point, while being otherwise insulated from the body material of the semiconductor chips.

11. The photo-detector array fabricating method of claim 10 wherein the step of etching the ends of the stacked chips is accomplished by a dry process using a gas plasma.

12. The photo-detector array fabricating method of claim 10 wherein each chip in the stack is separated from the adjacent chips by insulating material overlying the integrated circuitry, and the electrical contact points are partially supported by such material during the steps of first etching, and then depositing insulation material on, the focal plane ends of the chips, thereby preventing the protruding contact points from making electrical contact with the chip substrates.

13. A method for fabricating an electro-optical array module comprising:

provicing a number of equal-sized semiconductor chips, each having integrated circuitry thereon, and each having a multiplicity of closely spaced electrical contact points at one end thereof;

stacking and bonding the semiconductor chips to form a rectangular parallelepiped structure with the electrical contact points in an array of closely spaced points on a planar surface formed by the ends of the stacked chips;

etching the planar-surface-forming ends of the stacked chips to remove a small amount of the body material of the chips while leaving the contact points protruding;

depositing insulation material to cover the etched ends of the stacked chips; and removing sufficient material from the insulation-covered ends of the stacked chips to uncover the electrical contact points.

14. The module fabricating method of claim 13 wherein the step of etching the ends of the stacked chips is accomplished by a dry process using a gas plasma.

15. The module fabricating method of claim 13 wherein each chip in the stack is separated from the adjacent chips by insulating material overlying the integrated circuitry, and the electrical contact points are partially supported by such material during the steps of first etching, and then depositing insulation material on, the planar-surface-forming ends of the chips, thereby preventing the protruding contact points from making electrical contact with the chip substrates.

* * * * *